(12) United States Patent
Chu et al.

(10) Patent No.: US 6,245,657 B1
(45) Date of Patent: Jun. 12, 2001

(54) SELF-ALIGNED, LOW CONTACT RESISTANCE, VIA FABRICATION PROCESS

(75) Inventors: Wen-Ting Chu, Kaohsiung; Hsin-Ming Chen, Tainan, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/541,484

(22) Filed: Apr. 3, 2000

(51) Int. Cl.$^7$ ................................................ H01L 21/4763
(52) U.S. Cl. ........................ 438/618; 438/637; 438/672
(58) Field of Search .................................. 438/618, 637, 438/584, 629, 672

(56) References Cited

U.S. PATENT DOCUMENTS

| | | | |
|---|---|---|---|
| 5,472,912 | 12/1995 | Miller | 437/194 |
| 5,834,369 | * 11/1998 | Murakami et al. | |
| 5,956,609 | 9/1999 | Lee et al. | 438/627 |
| 5,994,213 | 11/1999 | Wang et al. | 438/622 |

* cited by examiner

Primary Examiner—Kevin M. Picardat
Assistant Examiner—D. M. Collins
(74) Attorney, Agent, or Firm—George O. Saile; Stephen B. Ackerman

(57) ABSTRACT

A process for fabricating an upper level, metal interconnect structure, self-aligned to an underlying metal plug structure, which in turn overlays, and contacts a lower level, metal interconnect structure, has been developed. The process features the formation of a recessed metal plug structure, in a via hole, overlying and contacting a portion of the top surface of the lower level, metal interconnect structure. Deposition of a metal layer is followed by a patterning procedure which results in the formation of a metal structure component, located on the surface of an insulator layer, defined by an overlying photoresist shape, with the metal structure component attached to a metal ring component, which is located in a top portion of a via hole, overlying and contacting, portions of the top surface of the recessed metal plug structure, with the metal ring component formed during the same patterning procedure, however unprotected by the photoresist shape. The metal ring structure is comprised of metal spacers, located on the sides of the top portion of the via hole.

19 Claims, 4 Drawing Sheets

SELF-ALIGNED, LOW CONTACT RESISTANCE, VIA FABRICATION PROCESS

BACKGROUND OF THE INVENTION (1) Field of the Invention

The present invention relates to methods used to fabricate semiconductor devices, and more specifically to a method used to improve the contact between a metal interconnect structure, and an underlying conductive plug structure, located in a via hole.

(2) Description of Prior Art

Micro-miniaturization, or the use of sub-micron features, has allowed the semiconductor industry to improve device density, resulting in improvements in device performance, and reductions in processing costs for a specific semiconductor device. The sub-micron features have in part been obtained via advancements experienced in the photolithographic discipline, such as the use of more advanced exposure tools, as well as the development of more sensitive photo sensitive materials. The use of sub-micron features can however in some cases, give rise to yield and performance degradations, not encountered with counterpart devices fabricated using larger features. For example the situation in which an upper level metal interconnect structure is designed to overlay, and contact, a portion of a metal plug structure, located in a via hole, which in turn allows electrical communication between the upper level metal interconnect structure, and a conductive region, underlying the metal plug structure, can be adversely influenced by sub-micron features, as well as by shrinking ground rules. The margin or error, encountered via misalignment of the upper level metal interconnect structure to a portion of the metal plug structure, may be difficult to contain when employing the sub-micron features achieved using advanced photolithographic procedures. This type of mis-alignment can lead to high resistance, performance problems, or even yield degrading opens, between metal interconnect structures.

This invention will describe a novel process sequence which allows self-alignment, and greater contact between metal interconnect structures, connected by a recessed metal plug in a via hole. Prior art such as Lee et al, in U.S. Pat. No. 5,956,609, as well as Wang et al, in U.S. Pat. No. 5,994,213, describe methods used to fabricate metal plug structures, however these prior arts do not described the metal ring structure, on a recessed plug structure located in a via or a contact hole, featured in this present invention.

SUMMARY OF THE INVENTION

The invention features the simultaneous formation of a metal interconnect structure, comprised of an upper level metal interconnect structure, and comprised of an attached metal ring, or metal shunt structure. The metal ring component of the metal interconnect structure is located around the inside perimeter of the via hole, thus overlaying and contacting portions of the underlying metal plug structure, providing self-alignment of the metal interconnect structure to the underlying metal plug structure, located in a via hole, and also providing increased contact area between these structures. Mis-alignment between the upper level metal interconnect structure, and the metal plug structure, is more easily tolerated as a result of the attached metal ring component, located in the via hole. The ability to tolerate mis-alignment allows the trend of using sub-micron features, and shrinking ground rules to continue, and to be used for sub-micron devices in static random access memory, (SRAM), cells, or other high density logic or memory cells.

It is an object of this invention form a metal interconnect structure that self-aligns to an underlying metal plug structure, located in a via hole.

It is another object of this invention form a metal interconnect structure, with an attached metal ring, or an attached metal shunt component, which is located overlying a portion of a recessed metal plug structure, which in turn is located in a via hole.

It is another object of this invention to recess a metal plug structure in a via hole, allowing deposition, and anisotropic etching of an overlying metal layer, to form a metal ring component for a metal interconnect structure, with the metal ring component located around the inside perimeter of the via hole, overlying a portion of the underlying recessed metal plug structure, in the via hole.

In accordance with the present invention a method of fabricating a metal interconnect structure, self-aligned to an underlying, recessed metal plug structure, featuring a metal ring component, of the metal interconnect structure, overlying and contacting a portion of the underlying, recessed metal plug structure, is described. A metal plug structure is formed in a via hole, with the metal plug structure overlying and contacting a lower level metal interconnect structure. After recessing of the metal plug structure in the via hole, a metal layer is deposited on the top surface of an insulator layer, in addition to coating the sides of, but not filling, the top portion of the via hole, that is not occupied by the recessed metal plug structure. A photoresist shape, and an anisotropic reactive ion etching, (RIE), procedure, are used to define an upper level metal interconnect structure comprised of a metal interconnect component, located on the top surface of the insulator layer, and to define an attached metal ring component, located overlying, and contacting portions of the underlying metal plug structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
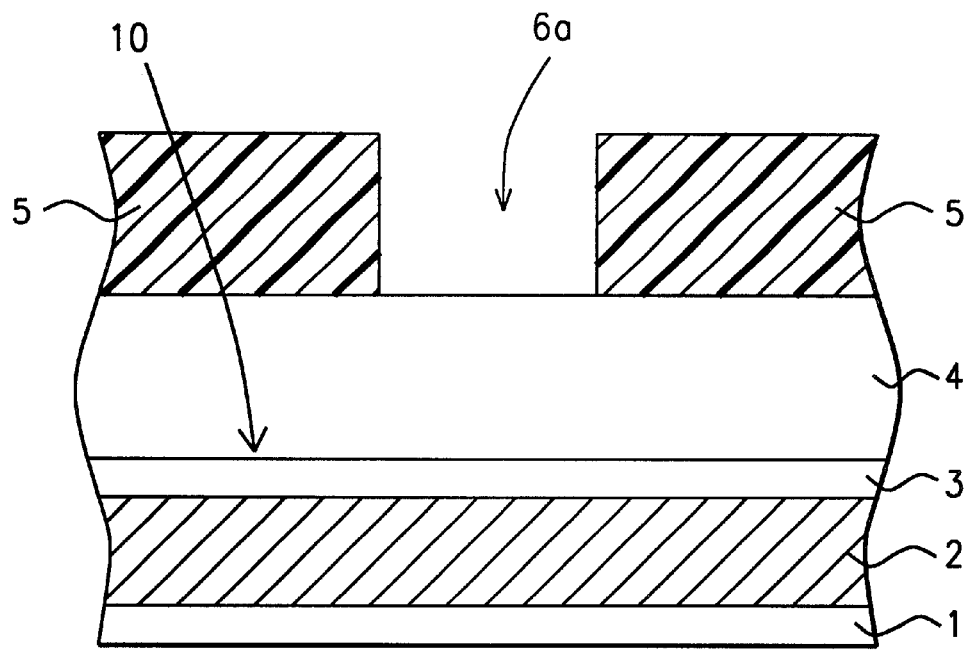
FIGS. 1–6, and 7B, which schematically, in cross-sectional style, describe key stages of fabrication, used to form a metal interconnect structure, self-aligned to an underlying, recessed metal plug structure, achieved via the formation of an attached metal ring component, located on the recessed metal plug structure.

The method of fabricating a metal interconnect structure, comprised with an attached metal ring component, overlaying, contacting, and self-aligned to, a recessed metal plug structure, located in a via hole, will now be described in detail. Lower level, metal interconnect structure 10, comprised of an aluminum based layer 2, underlying titanium nitride barrier layer 3, and overlying titanium nitride barrier layer 1, is schematically shown in FIG. 1. The titanium nitride layers are obtained via plasma vapor deposition, (PVD), procedures, each at a thickness between about 100 to 1500 Angstroms. Aluminum based layer 2, is an aluminum copper layer, also obtained via PVD procedures, at a thickness between about 2000 to 20000

Angstroms. The aluminum based layer 2, and both titanium nitride layer 1, and titanium nitride layer 3, can all be deposited in situ, in the same PVD tool. Patterning procedures used to define lower level metal interconnect structure 10, are accomplished via conventional photolithographic and reactive ion etching, (RIE), procedures, using $Cl_2$ or $SF_6$ as an etchant for the titanium nitride layers, and for the aluminum based layer. Lower level metal interconnect structure 10, can be located on an underlying interlevel dielectric, (ILD), layer, with a portion of lower level metal interconnect structure 10, contacting an underlying conductive region, such as a metal plug or interconnect structure. Lower metal interconnect structure 10, can also be located on an underlying ILD layer, with a portion of lower level, metal interconnect structure overlying and contacting an active device region, in a semiconductor substrate. This is not shown in the drawings. ILD layer 4, comprised of silicon oxide, or of borophosphosilicate glass, (BPSG), is next deposited via plasma enhanced chemical vapor deposition, (PECVD), or via low pressure chemical vapor deposition, (LPCVD), procedures, to a thickness between about 5000 to 30000 Angstroms. This is schematically shown in FIG. 1.

Figure 2:
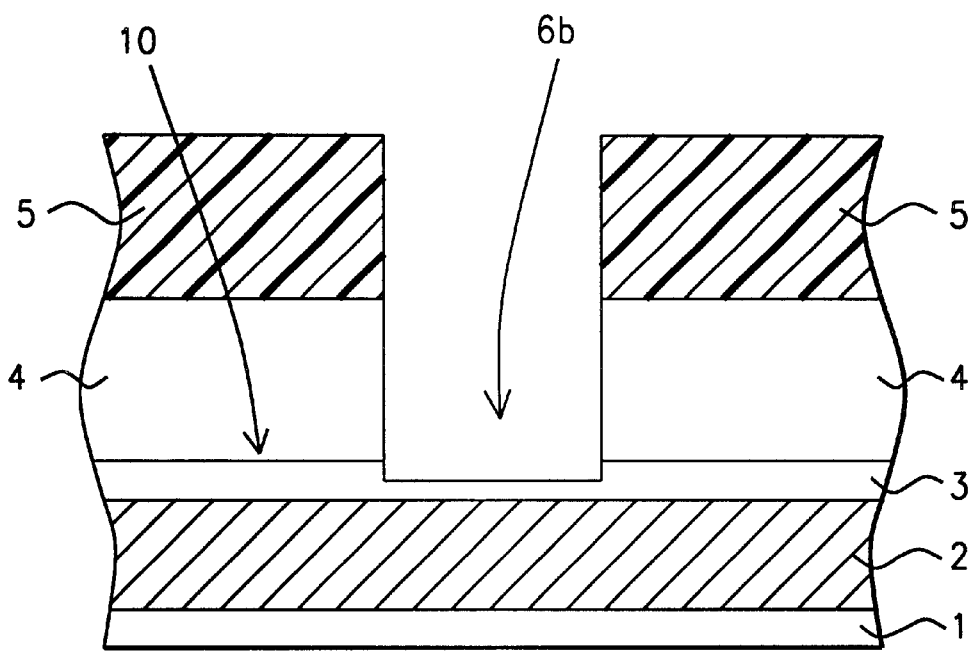

A photoresist shape 5, with opening 6a, to be used as a mask for defining a via hole opening in ILD layer 4, is next formed and shown schematically in FIG. 1. Opening 6a, in photoresist shape 5, has a diameter between about 0.10 to 1.0 um. An anisotropic RIE procedure is next performed using photoresist shape 5, as a mask, and using $CHF_3$ as an etchant for ILD layer 4, creating via hole 6b, shown schematically in FIG. 2. Via hole 6b, formed using opening 6a, in photoresist shape 5, as a mask, features the same diameter as opening 6a, between about 0.10 to 1.0 um. The anisotropic RIE procedure, is terminated at the appearance of titanium nitride barrier layer 3, with a top portion of this layer removed at endpoint.

Figure 3:
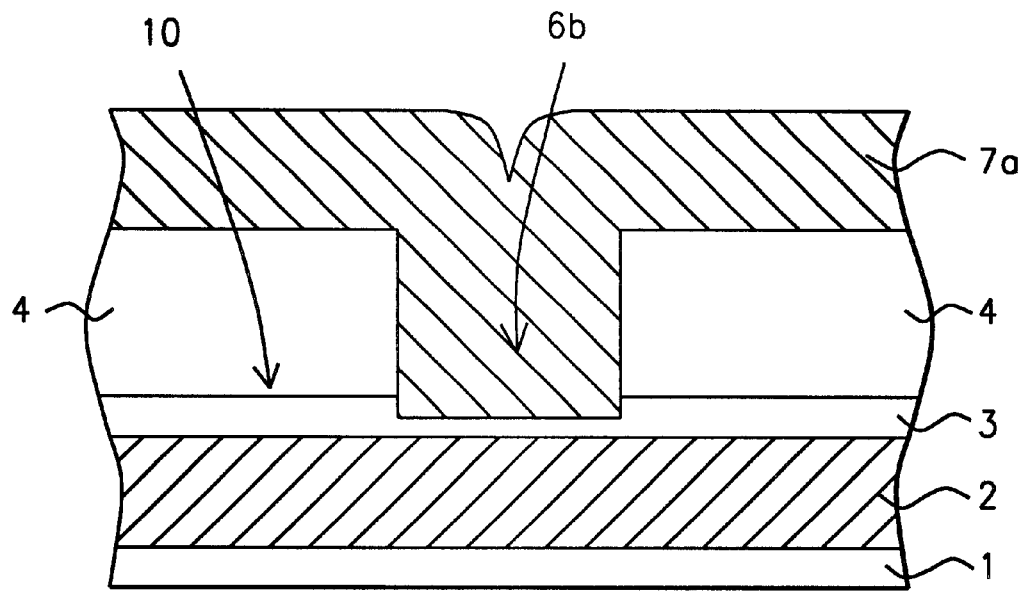
Figure 4:
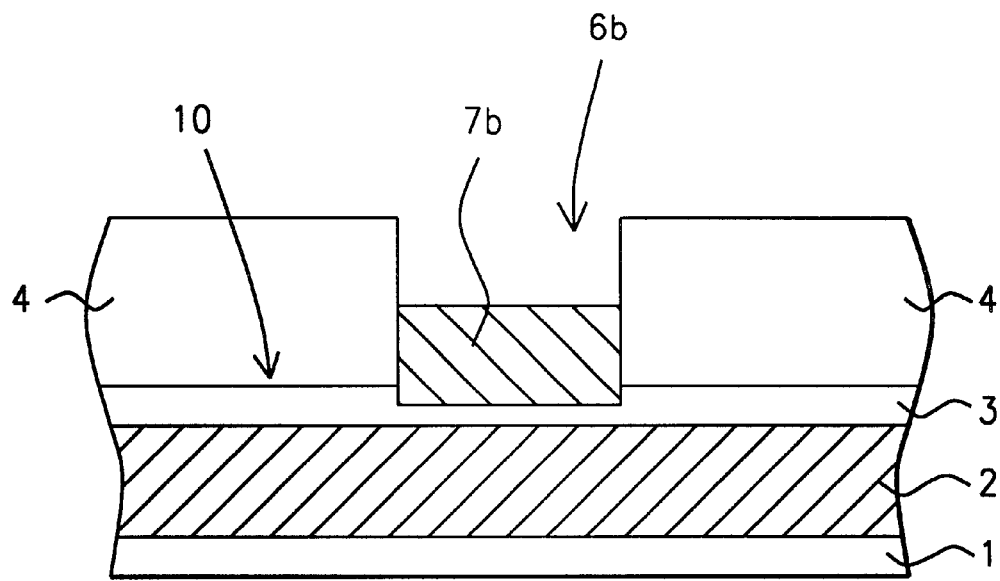

After removal of photoresist shape 5, via plasma oxygen ashing and careful wet clean procedures, tungsten layer 7a, is deposited via LPCVD procedures, using tungsten hexafluoride as a source. Tungsten layer 7a, schematically shown in FIG. 3, is deposited at a thickness between about 2000 to 10000 Angstroms, completely filling via hole 6b. A critical etch back of tungsten layer 7a, is next performed, via a selective RIE procedure, using $Cl_2$ or $SF_6$ as an etchant. The selective RIE procedure removes the region of tungsten layer 7a, from the top surface of ILD layer 4, and then is continued to remove a top portion of tungsten layer 7a, located in via hole 6b, creating recessed tungsten plug structure 7b, schematically shown in FIG. 4. The etch rate selectivity between tungsten, and ILD layer, of between about 10 to 1, using $Cl_2$ of $SF_6$, allows the desired recessing of tungsten to be realized without thinning ILD layer 4. The height of recessed tungsten plug structure 7b, or the remaining thickness of tungsten layer 7a, in via hole 6b, is between about 3000 to 20000 Angstroms.

Figure 5:
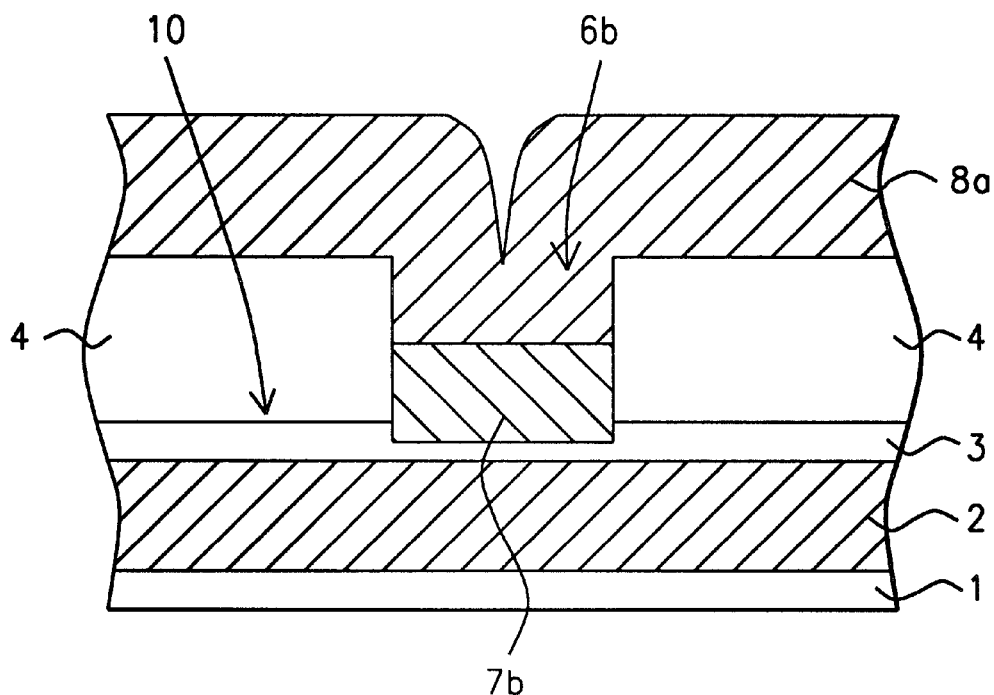
Figure 6:
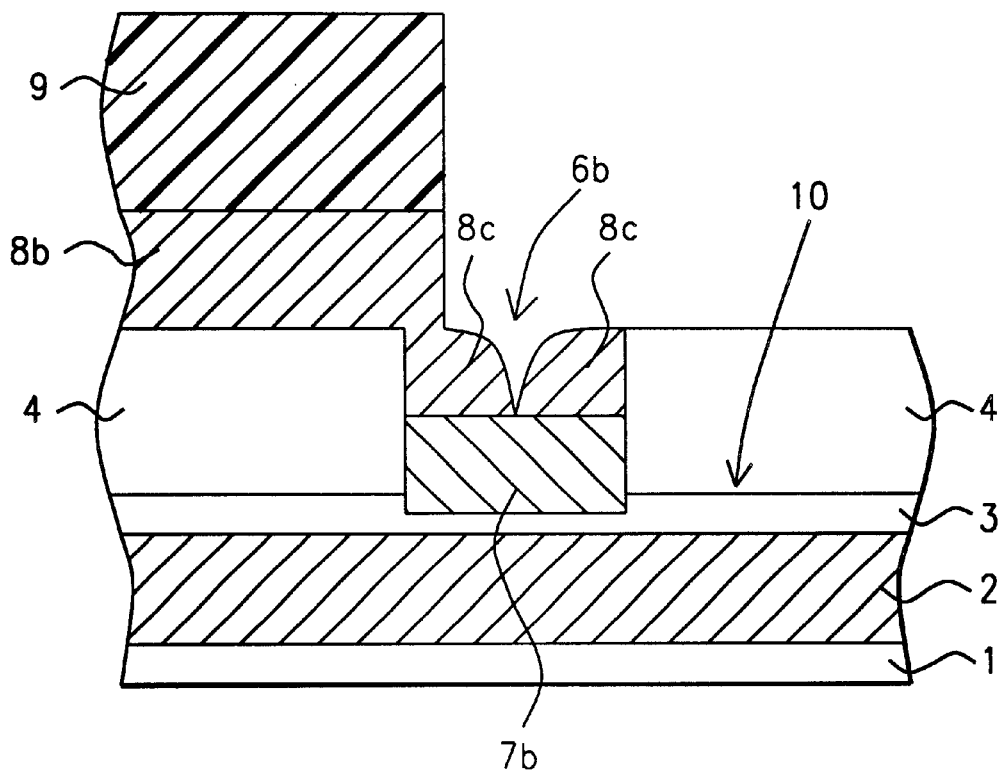

Metal layer 8a, comprised of aluminum, or an aluminum-copper layer, is next deposited, via PVD procedures, to a thickness between about 2000 to 20000 Angstroms. This is shown schematically in FIG. 5. Metal layer 8a, resides on the top surface of ILD layer 4, as well as on recessed tungsten plug structure 7b, in via hole 6b. Photoresist shape 9, shown schematically in FIG. 6, is next formed on metal layer 8a, with photoresist shape 9, overlaying a first portion of metal layer 8a, which resides on ILD layer 4, and overlaying a second portion of metal layer 8a, which is located in via hole 6b. It is imperative that second portion of metal layer 8a, in via hole 6b, be overlaid by photoresist shape 9. A critical anisotropic RIE procedure, using $Cl_2$ or $SF_6$ as an etchant, is used to remove regions of metal layer 8a, not protected by photoresist shape 9. The anisotropic RIE procedure results in complete removal of unprotected metal layer 8a, from the top surface of ILD layer 4, resulting in metal structure 8b, on ILD layer 4. The anisotropic RIE procedure, terminated at the appearance of ILD layer 4, also results partial removal of unprotected regions of metal layer 8a, located in via hole 6b, resulting in the formation of metal spacers 8c, on the sides via hole 6b. This is schematically shown in FIG. 6. Metal sidewalls 8c, form a metal ring, or metal shunt structure, overlying a portion of underlying, recessed tungsten plug structure 7b.

Figure 7A:
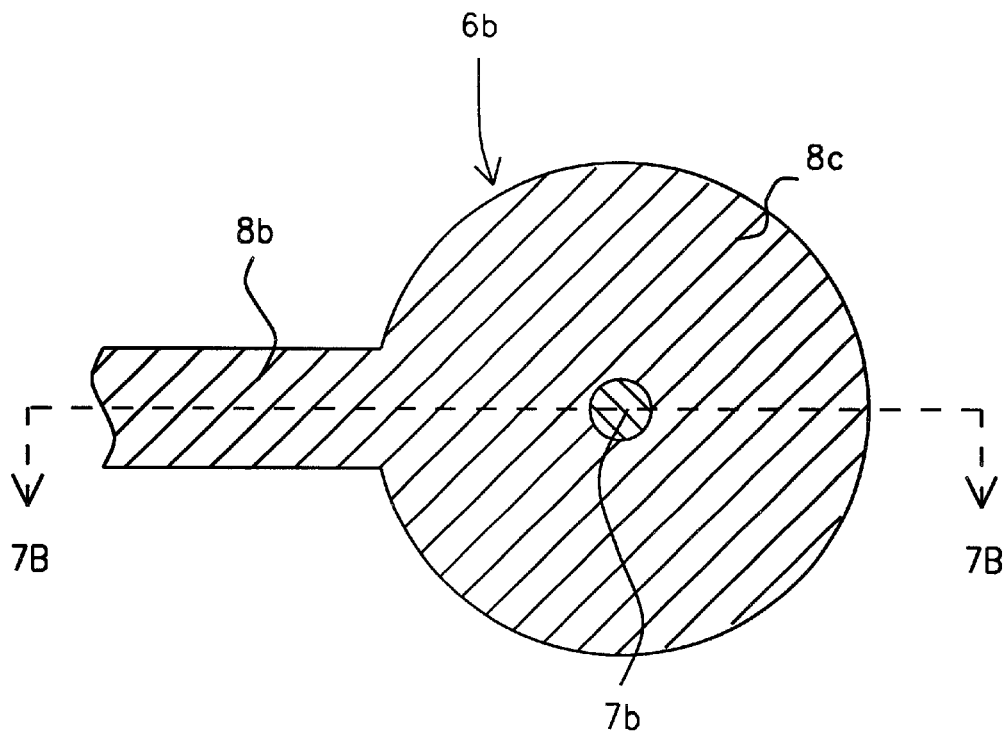
FIG. 7A, which schematically shows a top view of the metal interconnect structure, comprised with the attached metal ring component, overlying and contacting, the recessed metal plug structure.
Figure 7B:
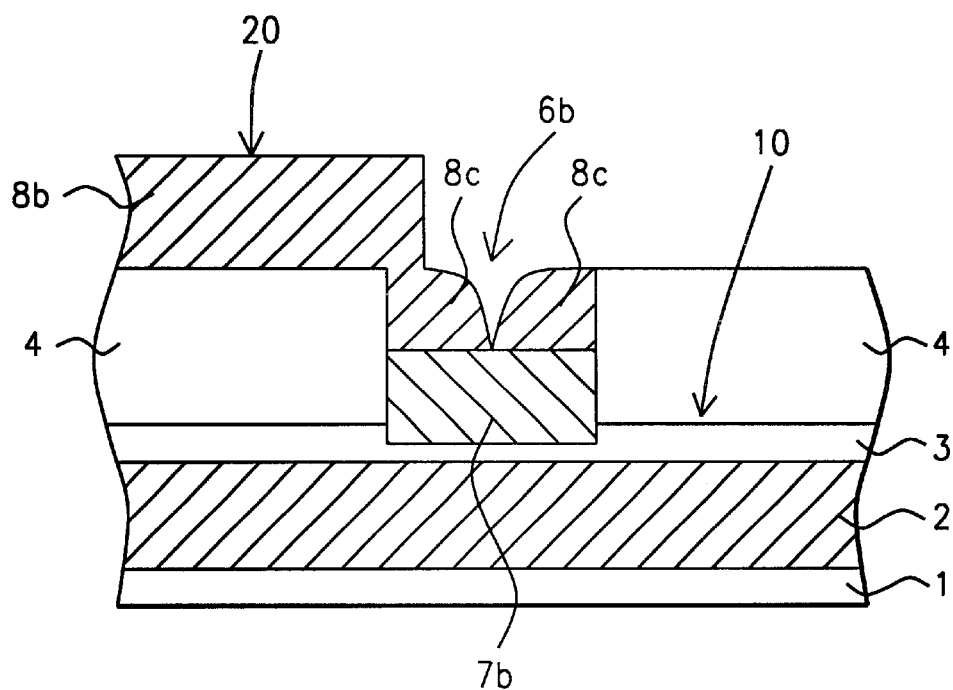

Removal of photoresist shape 9, via plasma oxygen ashing and careful wet cleans, results in the creation of upper level, metal interconnect structure 20, shown schematically in FIG. 7B. Upper level, metal interconnect structure 20, is comprised of metal interconnect component 8b, and the attached metal ring component, comprised of metal spacers 8c. The electrical and physical connection between lower level, metal interconnect structure 10, and upper level, metal interconnect structure 20, is realized using recessed tungsten plug structure 7b, wherein upper level, metal interconnect structure 20, is self-aligned to recessed metal plug structure 7b, via the metal ring component, or metal spacers 8c, attached to metal interconnect structure 8b. This process sequence, requiring only a portion of metal layer residing in via hole 7a, to be protected during the patterning procedure, allows a greater degree of mis-alignment, between defining photoresist shape 9, and via hole 6b, to be tolerated when compared to counterparts fabricated without a recessed tungsten plug, and without metal spacers on the sides of via hole 6b. The process sequence, described in this invention, can be used to fabricate high density, high speed SRAM cells, as well as other high density memory and logic cells, A top view of the upper level, interconnect structure, featuring the attached metal ring component, is schematically shown in FIG. 7A.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal interconnect structure, on a semiconductor substrate, self-aligned to an underlying metal plug structure, comprising the steps of:

forming a lower level, metal interconnect structure;

depositing an interlevel dielectric, (ILD), layer;

forming a via hole in said ILD layer, exposing a portion of a top surface of said lower level, metal interconnect structure;

forming a recessed metal plug structure in a bottom portion of said via hole;

depositing a metal layer;

forming a photoresist shape on a portion of said metal layer, located on said ILD layer; and located in an inside edge of said via hole; and patterning of said metal layer, using said photoresist shape as a mask, to form an upper level, metal interconnect structure comprised of: a metal structure component, defined from said portion of said metal layer protected by overlying said photoresist shape, and comprised of a metal ring component, not protected by said photoresist shape, during said patterning procedure, located in a top portion of said via hole, and with said metal ring component comprised of metal spacers on the sides of a top portion of said via hole, overlying and contacting a portion of said recessed metal plug structure.

2. The method of claim 1, wherein said lower level, metal interconnect structure is comprised of: an underlying titanium nitride layer, obtained via PVD procedures, at a thickness between about 100 to 1500 Angstroms, an aluminum, or aluminum-copper layer, obtained via PVD procedures, at a thickness between about 2000 to 20000 Angstroms; and an underlying titanium nitride layer, obtained via PVD procedures, at a thickness between about 100 to 1500 Angstroms.

3. The method of claim 1, wherein said ILD layer is a silicon oxide, or a borophosphosilicate glass layer, obtained via low pressure chemical vapor deposition, (LPCVD), or plasma enhanced chemical vapor deposition, (PECVD), procedures, at a thickness between about 5000 to 30000 Angstroms.

4. The method of claim 1, wherein said via hole is formed in said ILD layer via an anisotropic reactive ion etching, (RIE), procedure, using $CHF_3$ as an etchant.

5. The method of claim 1, wherein said via hole has a diameter between about 0.10 to 1.0 um.

6. The method of claim 1, wherein said recessed metal plug structure is a recessed tungsten plug structure, formed via deposition of a tungsten layer, via LPCVD procedures, at a thickness between about 2000 to 10000 Angstroms, and defined via a selective, anisotropic RIE procedure, using $Cl_2$ or $SF_6$ as an etchant.

7. The method of claim 1, wherein said recessed metal plug structure, in said bottom portion of said via hole, has a height between about 3000 to 20000 Angstroms.

8. The method of claim 1, wherein said metal layer is an aluminum, or an aluminum-copper layer, obtained via PVD procedures, at a thickness between about 2000 to 20000 Angstroms.

9. The method of claim 1, wherein said patterning procedure, used to form said upper level, metal interconnect structure, comprised of said metal structure component, and of attached, said metal ring component, is an anisotropic RIE procedure, applied to said metal layer, using $Cl_2$ or $SF_6$ an etchant.

10. A method of fabricating an upper level, metal interconnect structure, on a semiconductor substrate, with said upper level, metal interconnect structure self-aligned to an underlying, recessed tungsten plug structure, and with said upper level, metal interconnect structure comprised of a metal structure component, and an attached, metal ring component, with said metal ring component located in a top portion of a via hole, overlying and contacting said recessed tungsten plug structure, comprising the steps of:

forming a lower level, metal interconnect structure;

depositing an ILD layer;

forming a via hole in said ILD layer, exposing a portion of a top surface of said lower level, metal interconnect structure;

depositing a tungsten layer, completely filling said via hole; performing a first anisotropic RIE procedure to remove regions of said tungsten layer from a top surface of said ILD layer, creating a tungsten plug structure in said via hole;

continuing said first anisotropic RIE procedure, to form said recessed tungsten plug structure, in a bottom portion of said via hole;

depositing a metal layer on the top surface of said ILD layer, and on said recessed tungsten plug structure, in said via hole;

forming a photoresist shape overlying a portion of said metal layer that is located on a portion of the top surface of said ILD layer, and overlying a portion of said metal layer that is located on edges of said recessed tungsten plug structure; and performing a second anisotropic RIE procedure to remove regions of said metal layer, not protected by said photoresist shape, from the top surface of said ILD layer, creating said metal structure component, of said upper level, metal interconnect structure, while forming metal spacers on the sides of a top portion of said via hole, in regions unprotected by said photoresist shape, resulting in said metal ring component, of said upper level, metal interconnect structure, in said top portion of said via hole, with said metal ring component attached to said metal structure component, overlying and contacting said recessed tungsten plug structure, located in said bottom portion of said via hole.

11. The method of claim 10, wherein said lower level, metal interconnect structure is comprised of: an underlying titanium nitride layer, obtained via PVD procedures, at a thickness between about 100 to 1500 Angstroms, an aluminum, or aluminum-copper layer, obtained via PVD procedures, at a thickness between about 2000 to 20000 Angstroms; and an underlying titanium nitride layer, obtained via PVD procedures, at a thickness between about 100 to 1500 Angstroms.

12. The method of claim 10, wherein said ILD layer is a silicon oxide, or a borophosphosilicate glass layer, obtained via low pressure chemical vapor deposition, (LPCVD), or plasma enhanced chemical vapor deposition, (PECVD), procedures, at a thickness between about 5000 to 30000 Angstroms.

13. The method of claim 10, wherein said via hole is formed in said ILD layer via an anisotropic reactive ion etching, (RIE), procedure, using $CHF_3$ as an etchant.

14. The method of claim 10, wherein said via hole has a diameter between about 0.10 to 1.0 um.

15. The method of claim 10, wherein said tungsten layer is obtained via LPCVD procedures, at a thickness between about 2000 to 10000 Angstroms, using tungsten hexafluoride as a source.

16. The method of claim 10, wherein said first anisotropic RIE procedure, used to form said tungsten plug structure, in said via hole, and used to from said recessed tungsten plug structure, in said bottom portion of said via hole, is performed using $Cl_2$ or $SF_6$ as an etchant.

17. The method of claim 10, wherein said recessed tungsten plug structure, in said bottom portion of said via hole, has a height between about 3000 to 20000 Angstroms.

18. The method of claim 10, wherein said metal layer is an aluminum, or an aluminum-copper layer, obtained via PVD procedures, at a thickness between about 2000 to 20000 Angstroms.

19. The method of claim 10, wherein said second anisotropic RIE procedure, used to form said upper level, metal interconnect structure, comprised of said metal structure component, and of attached, said metal ring component, is performed using $Cl_2$ or $SF_6$ an etchant.

* * * * *